US012218141B2

(12) United States Patent
Lai et al.

(10) Patent No.: US 12,218,141 B2
(45) Date of Patent: Feb. 4, 2025

(54) HYBRID FIN FIELD-EFFECT TRANSISTOR CELL STRUCTURES AND RELATED METHODS

(71) Applicant: Taiwan Semiconductor Manufacturing Company Limited, Hsinchu (TW)

(72) Inventors: Wei-An Lai, Taichung (TW); Hui-Zhong Zhuang, Kaohsiung (TW); Jiann-Tyng Tzeng, Hsin Chu (TW); Wei-Cheng Lin, Taichung (TW); Lipen Yuan, Hsinchu County (TW); Yan-Hao Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 411 days.

(21) Appl. No.: 17/030,550

(22) Filed: Sep. 24, 2020

(65) Prior Publication Data
US 2021/0005633 A1 Jan. 7, 2021

Related U.S. Application Data

(63) Continuation of application No. 16/102,803, filed on Aug. 14, 2018, now Pat. No. 10,797,078.

(51) Int. Cl.
| | |
|---|---|
| *H01L 27/02* | (2006.01) |
| *H01L 27/12* | (2006.01) |
| *H01L 29/417* | (2006.01) |
| *H01L 29/66* | (2006.01) |
| *H01L 29/78* | (2006.01) |

(52) U.S. Cl.
CPC ...... *H01L 27/1211* (2013.01); *H01L 27/0207* (2013.01); *H01L 29/41791* (2013.01); *H01L 29/66795* (2013.01); *H01L 29/785* (2013.01)

(58) Field of Classification Search
CPC .......... H01L 27/1211; H01L 29/41791; H01L 29/66795; H01L 29/785
See application file for complete search history.

(56) References Cited

U.S. PATENT DOCUMENTS

| | | | | |
|---|---|---|---|---|
| 6,390,579 | B1 * | 5/2002 | Roylance | H04N 1/053 |
| | | | | 332/110 |
| 8,504,972 | B2 * | 8/2013 | Hou | G06F 30/39 |
| | | | | 716/135 |
| 9,547,741 | B2 * | 1/2017 | Schroeder | G06F 30/392 |
| 10,707,354 | B2 * | 7/2020 | Shimbo | H01L 29/0673 |
| 10,797,078 | B2 * | 10/2020 | Lai | H01L 27/0886 |
| 2006/0245534 | A1 * | 11/2006 | Shi | H03K 23/667 |
| | | | | 377/47 |

(Continued)

*Primary Examiner* — Vu A Vu
*Assistant Examiner* — Valerie N Newton
(74) *Attorney, Agent, or Firm* — Jones Day

(57) ABSTRACT

In one embodiment, an integrated circuit cell includes a first circuit component and a second circuit component. The first circuit component includes fin field-effect transistors (finFETs) formed in a high fin portion of the integrated circuit cell, the high fin portion of the integrated circuit including a plurality of fin structures arranged in rows. The second circuit component that includes finFETs formed in a less fin portion of the integrated circuit cell, the less fin portion of the integrated circuit including a lesser number of fin structures than the high fin portion of the integrated circuit cell.

20 Claims, 13 Drawing Sheets

(56) References Cited

U.S. PATENT DOCUMENTS

| | | | |
|---|---|---|---|
| 2011/0156148 A1* | 6/2011 | Yu | H01L 27/105 |
| | | | 257/E27.06 |
| 2013/0026572 A1 | 1/2013 | Kawa et al. | |
| 2013/0174103 A1* | 7/2013 | Shieh | H01L 21/845 |
| | | | 716/54 |
| 2013/0328162 A1 | 12/2013 | Hu et al. | |
| 2015/0179646 A1* | 6/2015 | Azmat | H01L 27/0207 |
| | | | 257/369 |
| 2015/0363268 A1* | 12/2015 | Chandra | G06F 11/0727 |
| | | | 714/801 |
| 2015/0370947 A1* | 12/2015 | Moroz | H10B 10/12 |
| | | | 716/119 |
| 2017/0110567 A1* | 4/2017 | Chen | H01L 21/32136 |
| 2017/0287909 A1 | 10/2017 | Oh et al. | |
| 2017/0373090 A1* | 12/2017 | Correale, Jr. | G06F 30/39 |
| 2019/0286783 A1* | 9/2019 | Yang | G03F 1/36 |

\* cited by examiner

HYBRID FIN FIELD-EFFECT TRANSISTOR CELL STRUCTURES AND RELATED METHODS

CROSS-REFERENCE TO RELATED APPLICATIONS

This application is a continuation application of U.S. patent application Ser. No. 16/102,803, filed Aug. 14, 2018, entitled "Hybrid Fin Field-Effect Transistor Cell Structures And Related Methods."

BACKGROUND

With increasing down-scaling of integrated circuits and increasingly demanding requirements for higher speed of integrated circuits, transistors need to have higher drive currents with increasingly smaller dimensions. Fin field-effect transistors (finFETs) were thus developed, and are often utilized to implement transistors and other devices in an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
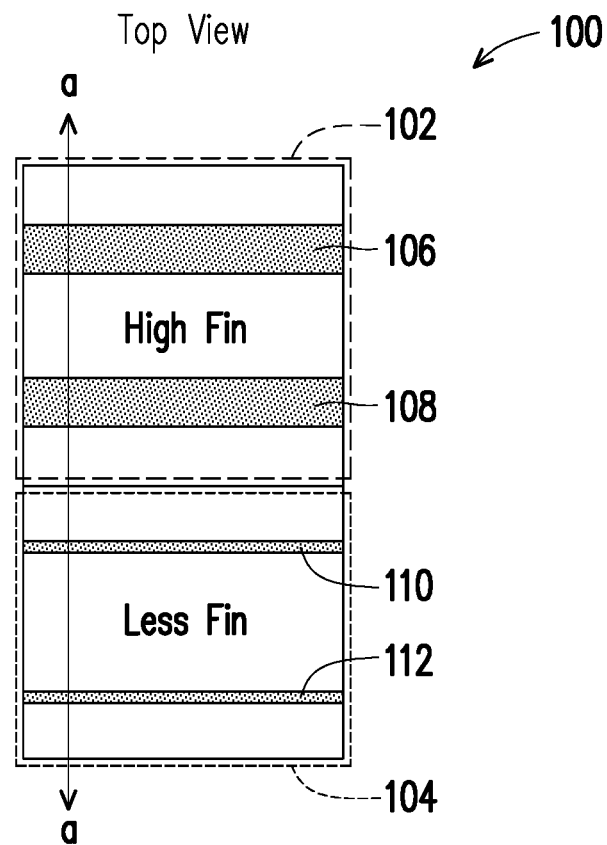
FIGS. 1A and 1B respectively show top and cross-sectional views of a portion of a hybrid integrated circuit cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The apparatus may be otherwise oriented (rotated 90 degrees or at other orientations) and the spatially relative descriptors used herein may likewise be interpreted accordingly.

A finFET typically includes a channel region implemented in a semiconductor "fin" structure and gate structures located adjacent to the fin structures. FinFETs have increased channel widths compared to planar transistors because the channels of a finFET include the sidewall portions in addition to the top surfaces of the fin structure. Since the drive current of a transistor is proportional to its channel widths, the drive currents of finFETs are increased over that of planar transistors. Drive current may be further increased in a finFET by including multiple fin structures. However, the inclusion of multiple fin structures may increase the power consumption and silicon footprint of the finFET. A standard cell library may therefore include both integrated circuit cells that utilize finFETs with multiple fin structures and other integrated circuit cells that utilize finFETs with a single (or lesser number) of fin structures. An integrated circuit designer may, for example, utilize standard cells with more or less fin structures depending on whether speed or power consumption is a more important factor for the particular circuit component.

Figure 1B:
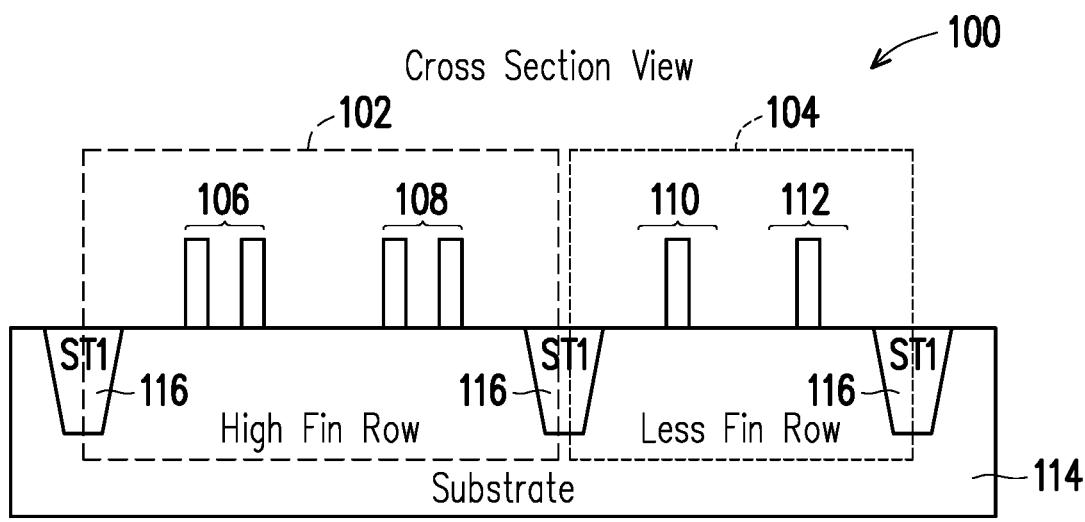

FIGS. 1A and 1B respectively show top and cross-sectional views of a portion of a hybrid finFET integrated circuit cell 100. The integrated circuit cell 100 may, for example, be a standard cell structure for a primitive logic device or other higher-level circuit that is included in a standard cell library for use in the design of larger, more complicated integrated circuits. The integrated circuit cell 100 includes a plurality of fin field-effect transistors (finFETs) that are formed by the intersection of gate structures with rows of "fin" shaped channel regions (referred to herein as "fins" or "fin structures"). As detailed above, finFET devices may be formed using a single fin structure or using multiple fin structures. FIGS. 1A and 1B, as well as other diagrams described herein, illustrate rows of fins that are used to form the finFETs making up the integrated circuit cell 100, but for simplicity omit the gate structures and other parts of the integrated circuit that are not relevant to the disclosure.

With reference first to FIG. 1A, the hybrid integrated circuit cell 100 includes a high fin portion 102 (also referred to herein as a "high fin row") and a less fin portion 104 (also referred to herein as a "less fin row"). The high fin portion 102 of the hybrid cell 100 includes fin rows 106, 108 that each include multiple fin structures. The less fin portion 104 of the cell includes fin rows 110, 112 that each include a lesser number of fin structures than the fin rows 106, 108 of the high fin portion 102. The difference in the number of fin structures in the fin rows of the high and less fin portions 102, 104 of the hybrid cell 100 is illustrated in FIG. 1A (and other diagrams described herein) by the thickness of the lines representing the fin rows. For example, the fin rows 106, 108 in the high fin portion 102 of FIG. 1A are drawn thicker than the fin rows 110, 112 in the less fin portion 104 of FIG. 1A, indicating a larger number of fin structures in the fin rows 106, 108 of the high fin portion 102. This is further illustrated by the cross-section diagram shown in FIG. 1B.

The cross-section shown in FIG. 1B is taken along line "a" in FIG. 1A. The cross-sectional diagram of FIG. 1B depicts the fin structures 106, 108, 110, 112 of the high and less fin rows 102, 104 extending above the cell semiconductor substrate 114. Also shown in FIG. 1B are shallow trench isolation (STI) regions 116 that are formed in the semiconductor substrate 114 to separate and isolate the different semiconductor regions. The example illustrated in FIG. 1B shows two fin structures in each of the fin rows 106, 108 of the high fin portion 102, and one fin structure in each of the fin rows 110, 112 of the less fin portion 104. In other examples, however, the high and less fin portions 102, 104 of the hybrid cell 100 may have a greater number of fin structures, so long as the number of fins in each fin row of the high fin portion 102 is greater than the number of fins in each fin row of the less fin portion 104.

Figure 2:
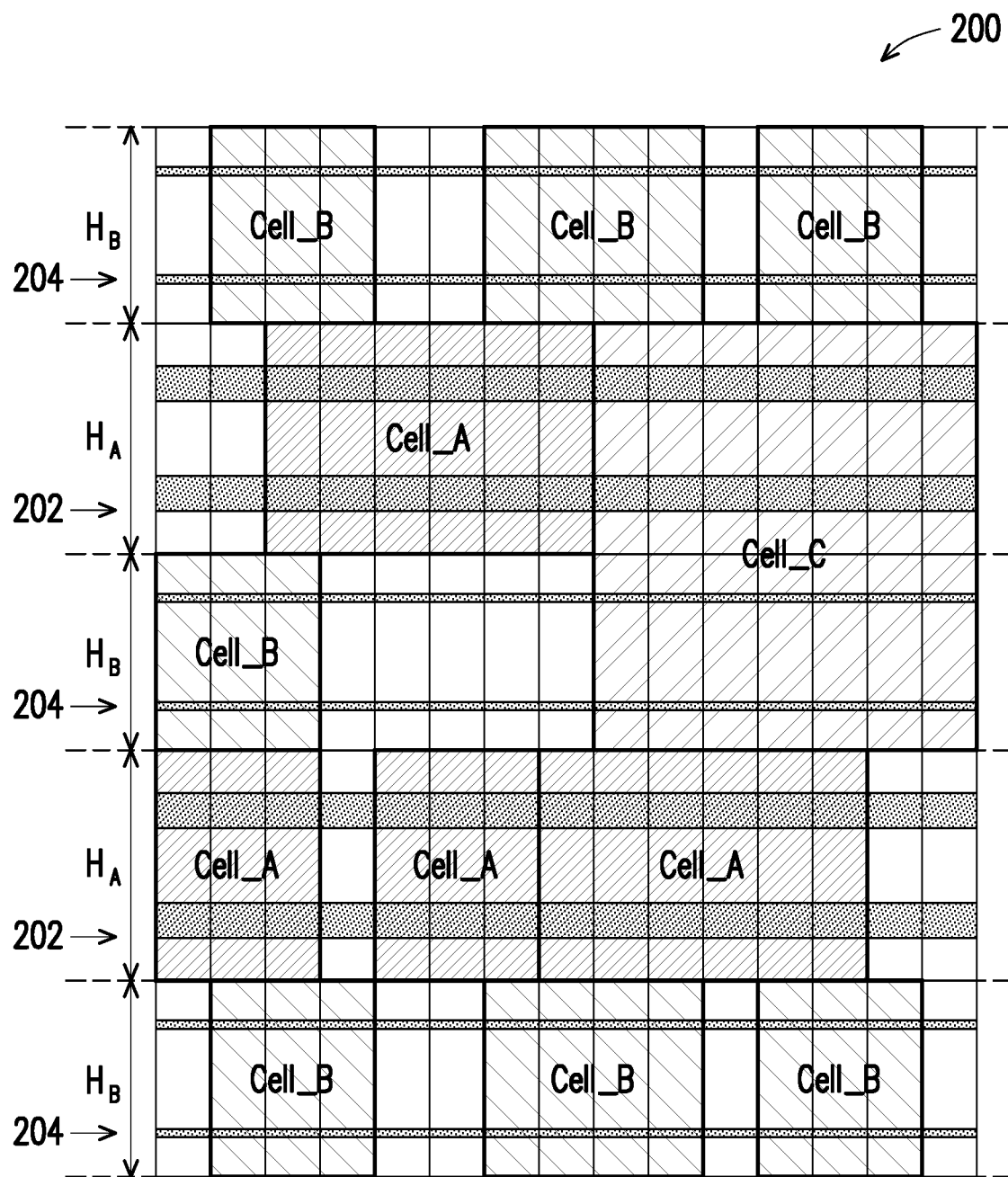
FIG. 2 is a diagram of an example integrated circuit layout in accordance with some embodiments.

FIG. 2 is a diagram of an example integrated circuit layout 200. The example layout 200 shown in FIG. 2 utilizes three types of standard cells, respectively labeled Cell_A, Cell_B and Cell_C, that are each formed using finFETs. Specifically, the example standard cells labeled Cell_A are formed using only high fin rows 202, the example standard cells labeled Cell_B are formed using only less fin rows 204, and the example standard cell labeled Cell_C is a hybrid cell that is formed using both high and less fin rows 202, 204. In addition to differentiating the high and less fin rows based on the thickness of the fin rows, FIG. 2 also illustrates the difference in cell heights, $H_A$ and $H_B$, resulting from the different number of fins. As shown, high fin rows take up more area on the integrated circuit, resulting in a larger cell height ($H_A$). The illustrated hybrid standard cell (Cell_C) is referred to as a "double height" cell because it includes two adjacent fin rows 202, 204, i.e., with a cell height of $H_A+H_B$. The other illustrated standard cells (Cell_A and Cell_B) are referred to as "single height" cells because they each include only a single fin row, i.e., with a cell height of either $H_A$ or $H_B$. The example hybrid cells described herein are each "double height" cells. It should be understood, however, that in other examples a hybrid cell could include more than two adjacent fin rows.

As detailed above, the number of fin structures in a finFET cell may have a direct effect on both the speed and power consumption of the integrated circuit, as well as the size of the cell's silicon footprint. A finFET cell with a greater number of fin structures will typically operate faster than the same circuit in a finFET cell with a fewer number of fin structures. But a cell with less fin structures often provides power and area benefits over cells with a greater number of fin structures. An integrated circuit designer may, therefore, layout an integrated circuit using standard cells with both high and less fin rows (e.g., Cell_A and Cell_B), as illustrated in FIG. 2, depending on whether speed or power consumption is a more important factor for the particular circuit component.

A hybrid finFET cell, such as Cell_C depicted in FIG. 2, may be utilized in an integrated circuit design to provide both the speed benefit of the high fin row 202 and the power and area benefit of the less fin row 204. The example integrated circuit layouts depicted in FIGS. 3-8 provide examples of hybrid standard cells that are optimized for a desired performance. In many cases, these optimized hybrid cells are able to demonstrate better performance than the same circuits implemented using only high fin rows or only less fin rows.

Figure 3A:
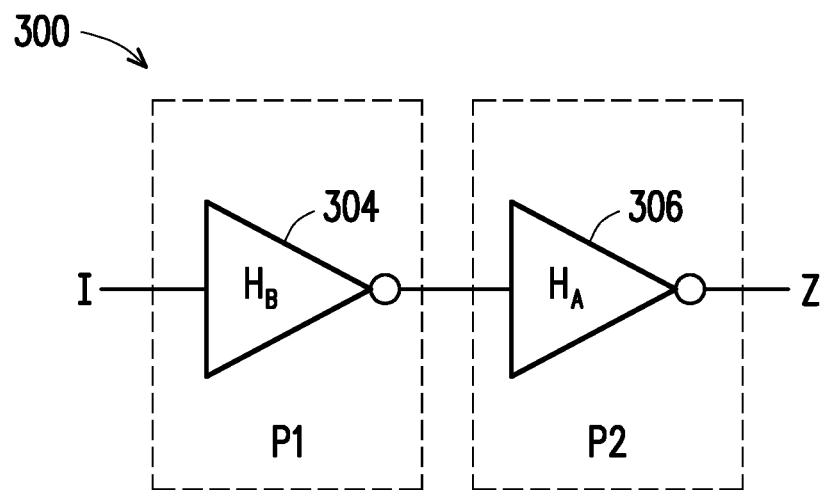
FIGS. 3A and 3B depict an example hybrid finFET cell for a multi-stage buffer in accordance with some embodiments.
Figure 3B:
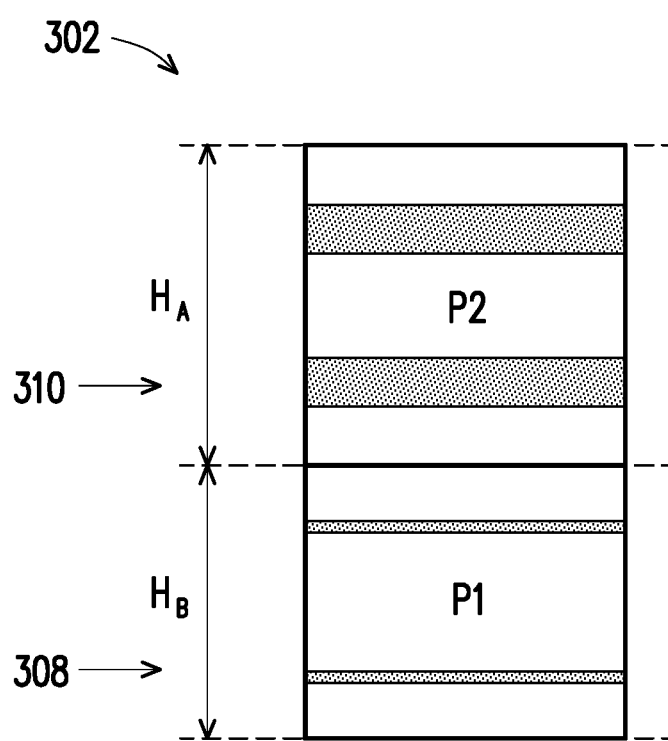

FIGS. 3A and 3B depict an example hybrid finFET cell for a multi-stage buffer. A circuit diagram 300 of the multi-stage buffer is shown in FIG. 3A, and the cell layout 302 for the multi-stage buffer is shown in FIG. 3B. With reference first to FIG. 3A, the multi-stage buffer includes a first inverter stage 304 having an output coupled to the input of a second inverter stage 306. In operation, the multi-stage buffer 300 receives an input (I) and generates a buffered output (Z).

Cross referencing FIGS. 3A and 3B, the first inverter stage 304 is included in a less fin row 308 of the hybrid cell layout 302, and the second inverter stage 306 is included in a high fin row 310 of the hybrid cell layout 302. Implementing the multi-stage buffer 300 in a double height ($H_A+H_B$) cell 302 with the first inverter stage 304 in a less fin row 308 and the second inverter stage 306 in a high fin row 310 affects the driving ratio of the circuit. The inventors have concluded that the resultant driving ratio of the first and second inverter stages 304, 306 in the illustrated hybrid cell layout 302 may improve circuit performance (speed) over that of the same circuit 300 implemented in a single height cell with only a high fin row ($H_A$). For example, the inventors found an approximate 2-5% improvement in speed over a previous design implemented in a single height cell with only a high fin row ($H_A$).

Figure 4A:
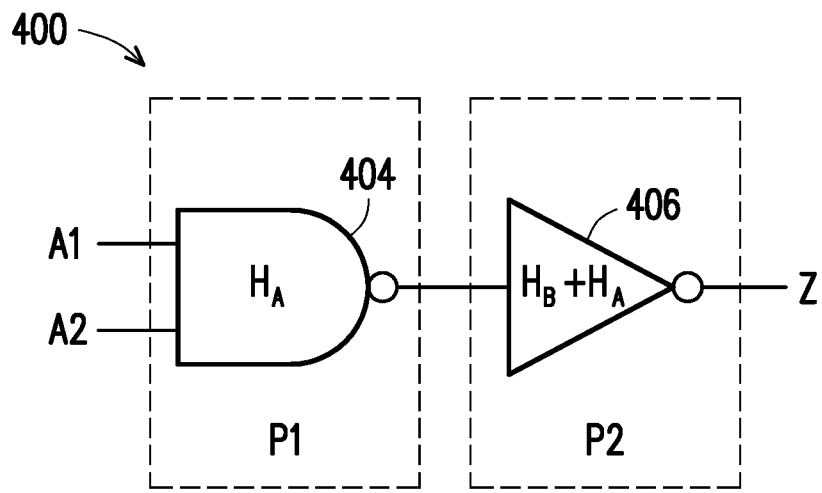
FIGS. 4A and 4B depict an example hybrid finFET cell for a multi-stage logic gate in accordance with some embodiments.
Figure 4B:
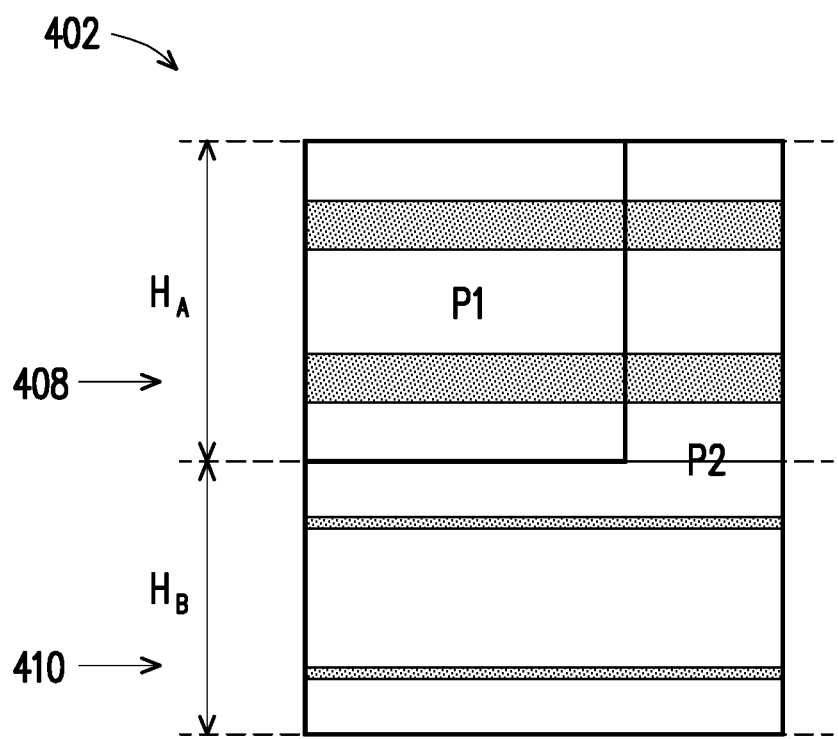

FIGS. 4A and 4B depict an example hybrid finFET cell for a multi-stage logic gate. A circuit diagram 400 of the multi-stage logic gate is shown in FIG. 4A, and the cell layout 402 is shown in FIG. 4B. With reference first to FIG. 4A, the multi-stage logic gate 400 includes a NAND gate stage 404 having an output coupled to the input of an inverter stage 406. In operation, the multi-stage logic gate 400 generates an output (Z) that is a logic combination of its inputs (A1, A2).

Cross referencing FIGS. 4A and 4B, the NAND gate 404 is included in a high fin row 408 of the hybrid cell layout 402, and the inverter stage 406 is implemented in both the high fin row 408 and a less fin row 410. Implementing the multi-stage logic gate 400 in a double height ($H_A+H_B$) cell 402, as shown, may improve circuit performance (speed) over that of the same circuit 400 implemented in a single height cell with only a high fin row ($H_A$). For example, the inventors found an approximate 1-4% improvement in speed over a previous design implemented in a single height cell with only a high fin row ($H_A$). This improvement results, at least in part, because placing the NAND gate 404 in a high fin row 408 compensates for the weak driving effect of cascade transistors in the NAND gate 404.

Figure 5A:
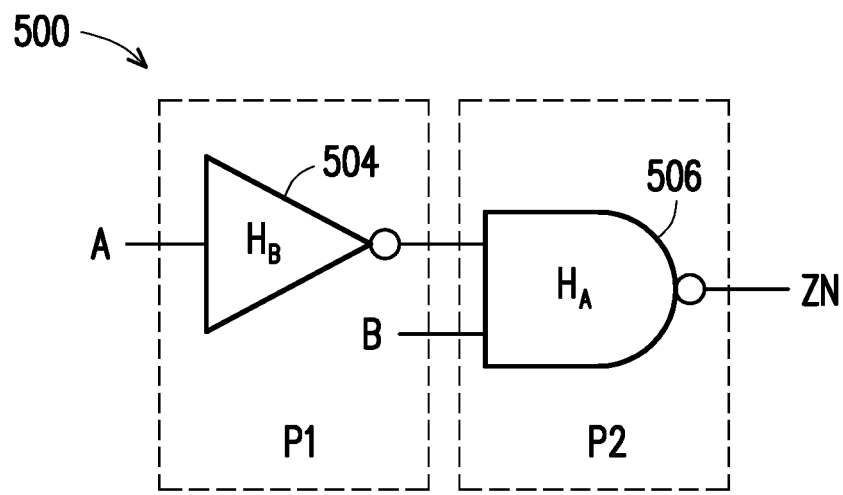
FIGS. 5A and 5B depict another example hybrid finFET cell for a multi-stage logic gate in accordance with some embodiments.
Figure 5B:
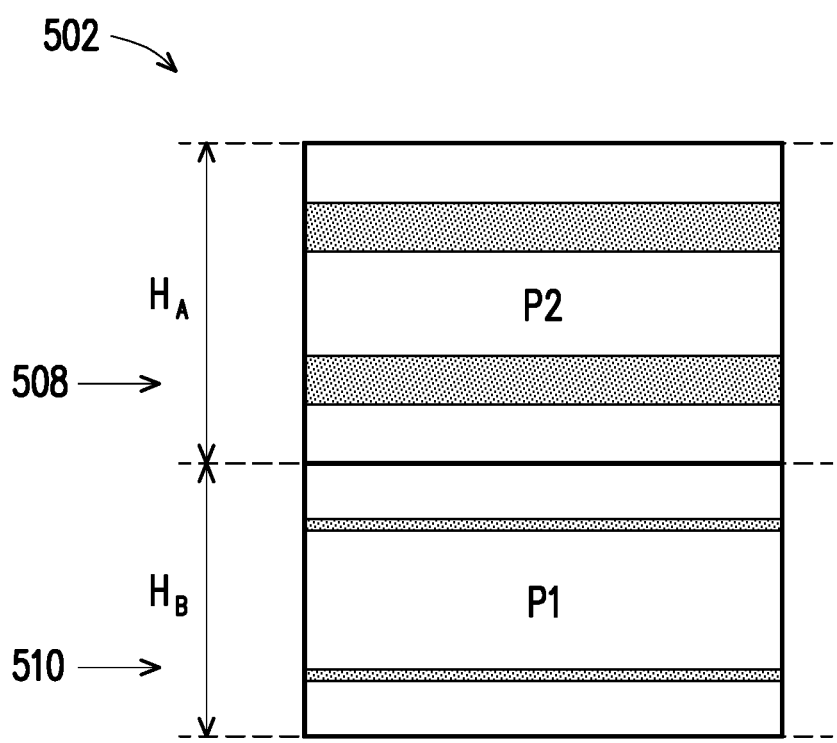

FIGS. 5A and 5B depict another example hybrid finFET cell for a multi-stage logic gate. A circuit diagram 500 of the multi-stage logic gate is shown in FIG. 5A, and the cell layout 502 is shown in FIG. 5B. With reference first to FIG. 5A, the multi-stage logic gate 500 includes an inverter stage 504 having an output coupled to an input of a NAND gate stage 506. In operation, the multi-stage logic gate 500 generates an output (ZN) that is a logic combination of its inputs ($\overline{A}$, B).

Cross referencing FIGS. 5A and 5B, the NAND gate 506 is included in a high fin row 508 of the hybrid cell layout 502, and the inverter stage 504 is included in a less fin row 510. Implementing the multi-stage logic gate 500 in a double height ($H_A+H_B$) cell 502, as shown, may improve circuit performance (speed) over that of the same circuit 500 implemented in a single height cell with only a high fin row ($H_A$). For example, the inventors found an approximate 1-3% improvement in speed over a previous design implemented in a single height cell with only a high fin row ($H_A$).

Figure 6A:
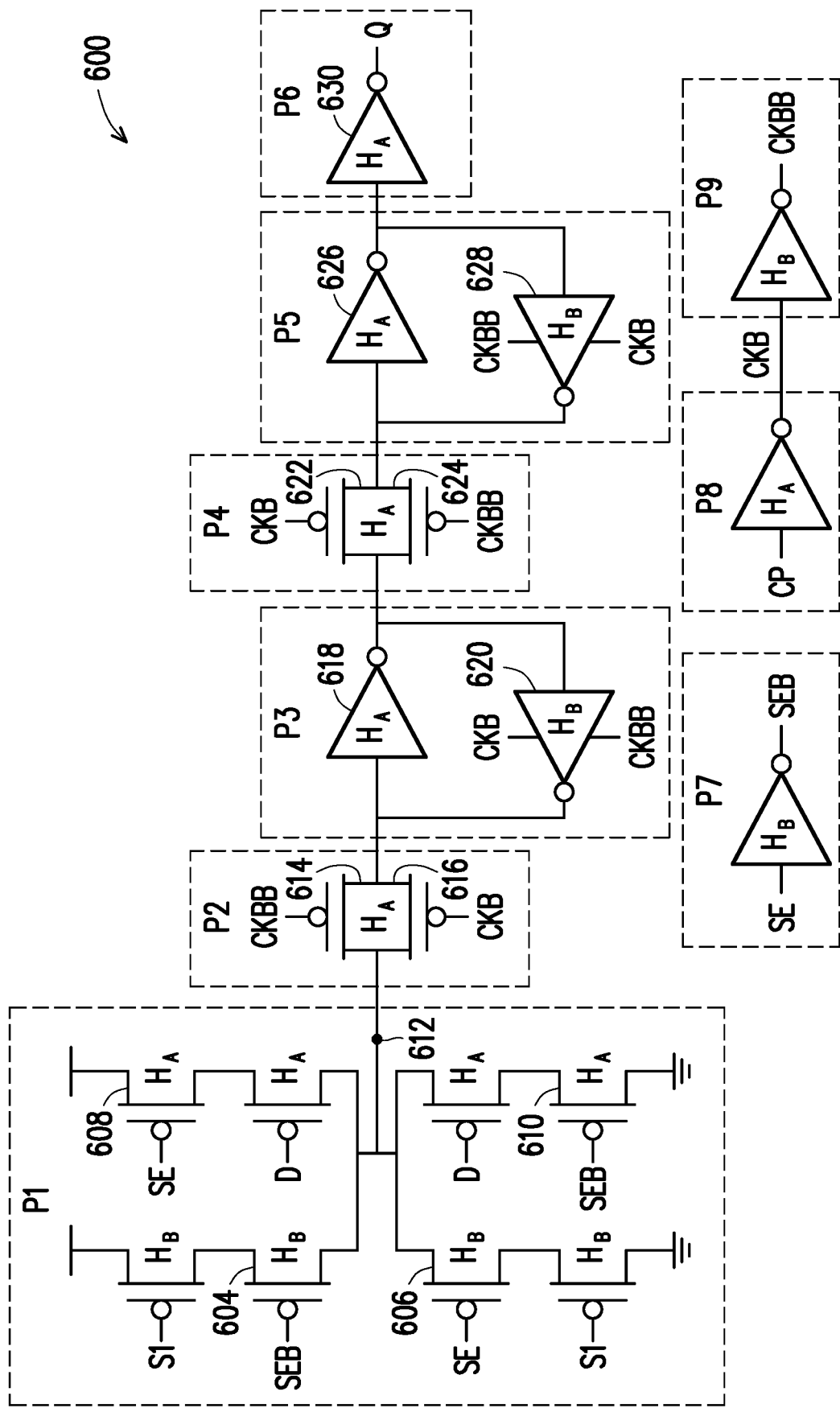
FIGS. 6A and 6B depict an example hybrid finFET cell for a scan flip-flop circuit that is optimized for speed in accordance with some embodiments.
Figure 6B:
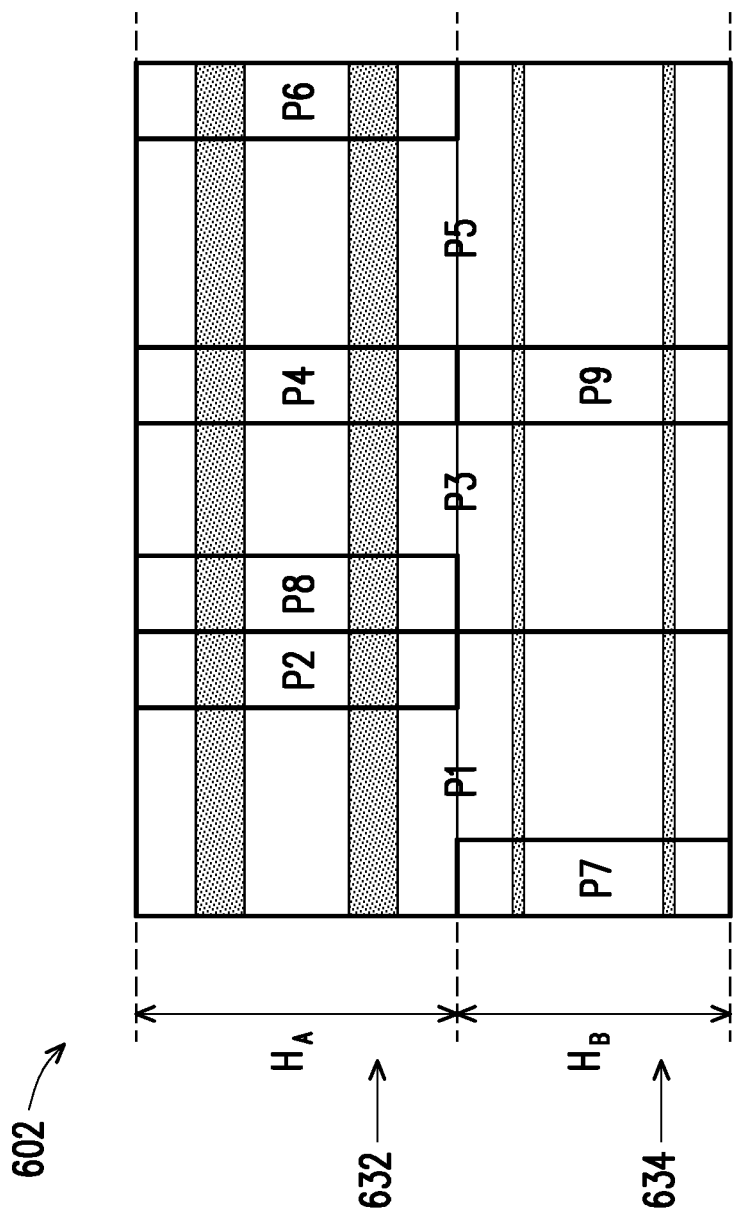

FIGS. 6A and 6B depict an example hybrid finFET cell for a scan flip-flop circuit that is optimized for speed. A circuit diagram 600 of the scan flip-flop circuit is shown in FIG. 6A, and the cell layout 602 for the scan flip-flop circuit is shown at FIG. 6B. A scan flip-flop, such as the example depicted in FIG. 6A, is one of the most frequently adopted standard cells. In operation, a scan flip-flop may be switched between a normal operation mode and a scan test mode. With reference first to FIG. 6A, the architecture of the scan flip-flop 600 is equivalent to a multiplexer (P1) followed by a master-slave flip-flop (P2-P6). The scan flip-flop circuit 600 further includes a multi-stage inverter (P8-P9), where the first inverter stage (P8) inverts clock signal CP to generate clock signal CKB, and the second inverter stage (P9) inverts clock signal CKB to generate clock signal CKBB. Also included in the scan flip-flop circuit 600 is an inverter (P7) that inverts the signal at the terminal SE to generate an output at terminal SEB.

When the scan flip-flop 600 operates in scan test mode, the terminal SE is raised to a high logic level so that transistors 604, 606 within the multiplexer (P1) are turned on and transistors 608, 610 are turned off, and the voltage at node 612 can be controlled by the signal at scan chain terminal SI. When the scan flip-flop 600 operates in normal operation mode, the terminal SE is pulled down to a low logic level, causing transistors 608, 610 within the multiplexer (P1) to turn on and transistors 604, 606 to turn off, and the voltage at node 612 can be controlled by the signal at terminal D in a normal flip-flop mode.

The flip-flop portion of the circuit 600 includes five stages, P2-P6. In the first stage (P2) of the flip-flop circuit, gates of transistors 614 and 616 are respectively coupled to clock terminals CKBB and CKB; and the source and drain of transistors 614 and 616 are coupled between node 612 and the stage output. The second stage (P3) of the flip-flop circuit forms a latch that includes a first inverter 618 coupled in a forward path between the stage input and output, and a second inverter 620 coupled in a feedback configuration and enabled and disabled by clocks at terminals CKB and CKBB. In the third stage (P4) of the flip-flop circuit, gates of transistors 622 and 624 are respectively coupled to clock terminals CKB and CKBB; and the source and drain of transistors 622 and 624 are coupled between the stage input and output. The fourth stage (P5) of the flip-flop circuit forms a second latch that includes a first inverter 626 coupled in a forward path between the stage input and output, and a second inverter 628 coupled in a feedback configuration and enabled and disabled by clocks at terminals CKBB and CKB. The final stage (P6) of the flip-flip circuit includes an inverter 630 that inverts the output of the fourth stage (P5) to generate the flip-flip output at terminal Q.

In normal-mode operation, when the clock at terminal CKBB is logic low (0), the clock at terminal CKB is logic high (1), so that transistors 614 and 616 in the first flip-flop stage (P2) are turned on, and the transistors 622, 644 in the third stage (P4) are turned off, allowing the signal at the flip-flop input to be conducted through and latched between the inverters 618, 620 of the second stage (P3). When the clock at terminal CKBB transitions to logic high (1), the clock at terminal CKB transitions to logic low (0), so that the transistors 622 and 624 in the third flip-flop stage turn on, the transistors 618, 620 in the first stage (P2) turn off, and the signal previously latched in the second stage (P3) is conducted through and latched between the inverters 626, 628 in the fourth stage (P5) and output at terminal Q.

Cross referencing FIGS. 6A and 6B, portions of the scan flip-flop circuit 600 are included in a high fin row 632 of the hybrid cell layout 602, and other portions of the scan flip-flop circuit 600 are included in a less fin row 634 of the hybrid cell layout 602. Circuit components that are included in the high fin row 632 are identified in FIG. 6A with a reference numeral "2" and circuit components that are included in the less fin row 634 are identified in FIG. 6A with a reference numeral "1."

Specifically, the multiplexer (P1) includes a first plurality of transistors in a scan chain portion of the multiplexer circuit that are included in the less fin row 634, and a second plurality of transistors in the normal operation portion of the multiplexer circuit that are included in the high fin row 632. The first (P2), third (P4), and fifth (P6) stages of the flip-flop circuit are each implemented in the high fin row 632. The second (P3) and fourth (P4) stages of the flip-flop circuit each include a first inverter 618, 626 implemented in the high fin row 632, and a second inverter 620, 628 implemented in the less fin row 632. The multi-stage clock inverter circuit (P8 and P9) includes a first inverter stage (P8) included in the high fin row 632 and a second inverter stage (P9) included in the less fin row 634. Finally, the signal inverter (P7) is implemented in the less fin row 634.

The scan flip-flop circuit 600 illustrated in FIGS. 6A and 6B is optimized for speed by including both of the first (P2) and third (P4) flip-flop stages within the high fin row 632 of the of the hybrid cell layout 602. The inventors have determined that implementing the scan flip-flop circuit 600 in a hybrid double height ($H_A+H_B$) cell 602, as shown, may improve circuit performance (speed) over even that of the same circuit 600 implemented entirely with high fin rows. This performance optimization is achieved by including circuit components within the critical path of the flip-flop circuit 600 within the high fin row 632, while including components that are less critical to the speed of normal-mode operation within the less fin row 602.

Figure 7A:
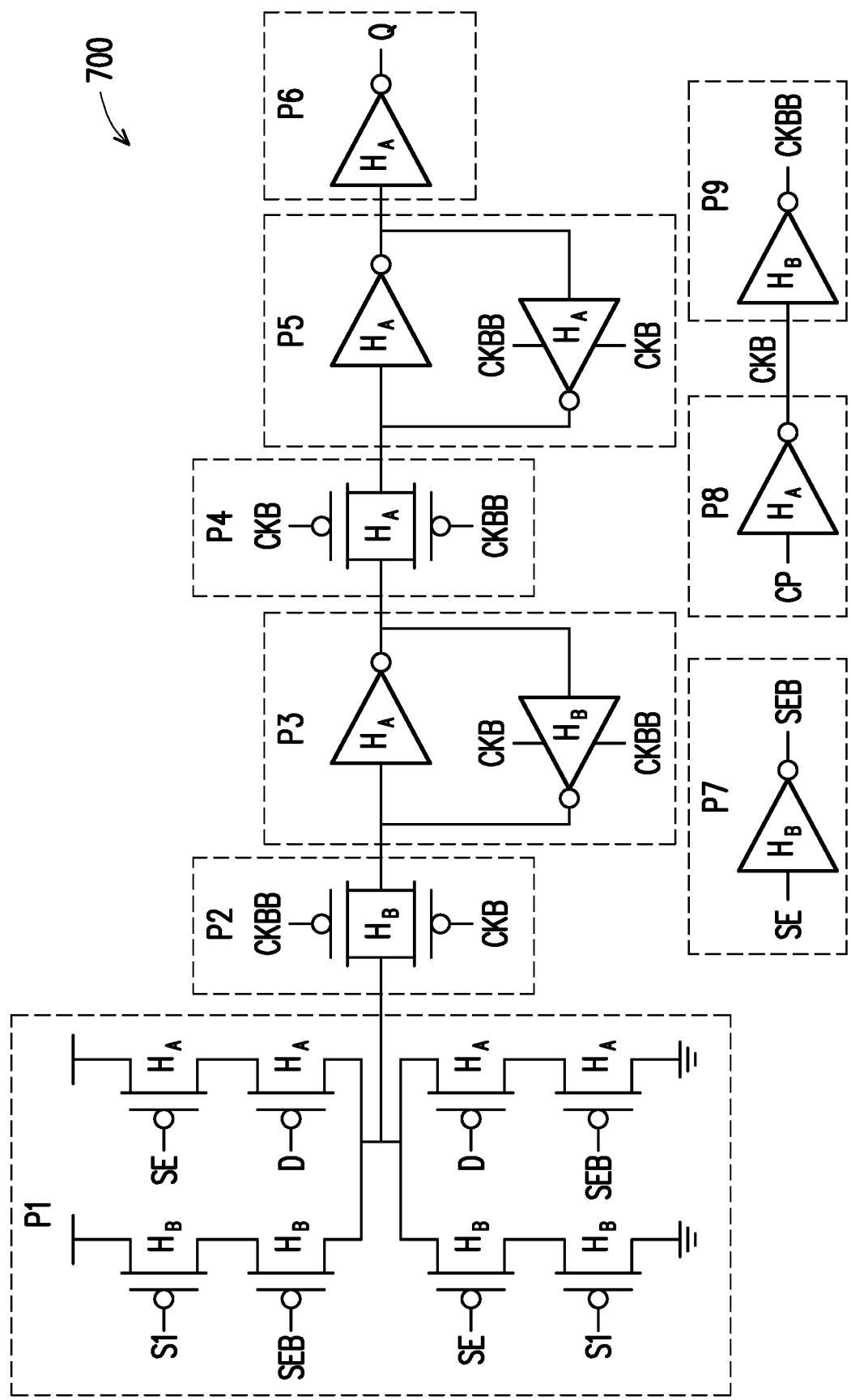
FIGS. 7A and 7B depict an example hybrid finFET cell for a scan flip-flop circuit that is optimized for power consumption in accordance with some embodiments.
Figure 7B:
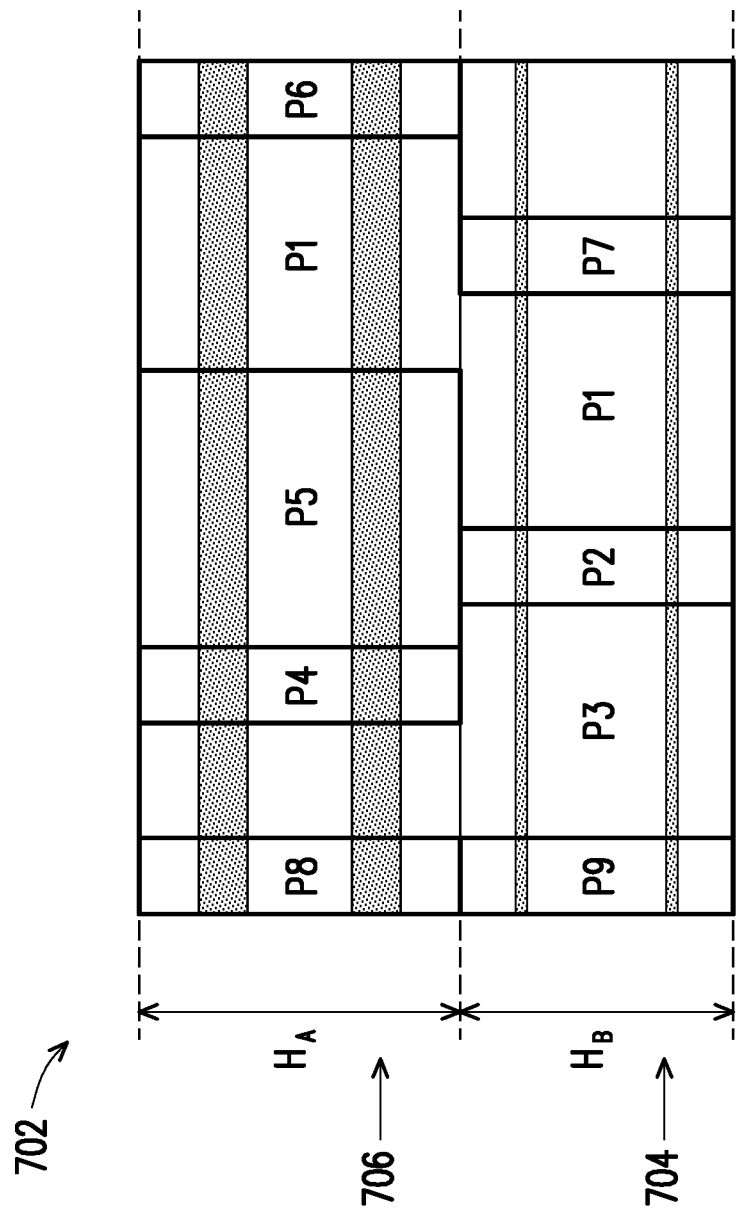

FIGS. 7A and 7B depict an example hybrid finFET cell for a scan flip-flop circuit that is optimized to reduce power consumption. The circuit diagram 700 of the scan flip-flop circuit is shown in FIG. 7A, and the cell layout 702 for the scan flip-flop is shown at FIG. 7B. The scan flip-flop circuit 700 depicted in FIGS. 7A and 7B is the same as the scan flip-flop circuit 600 depicted in FIGS. 6A and 6B, expect that in the embodiment shown in FIGS. 7A and 7B, the finFET transistors of the first stage (P2) of the flip-flip portion of the circuit 700 are implemented in the less fin row 704, instead of the high fin row 706. By moving the first flip-flop stage (P2) to the less fin row 704, the power consumption of the circuit is reduced at the expense of circuit performance (speed.) For example, the inventors found an approximate 15% reduction in internal power consumption over a previous design implemented with only high fin rows.

Figure 8A:
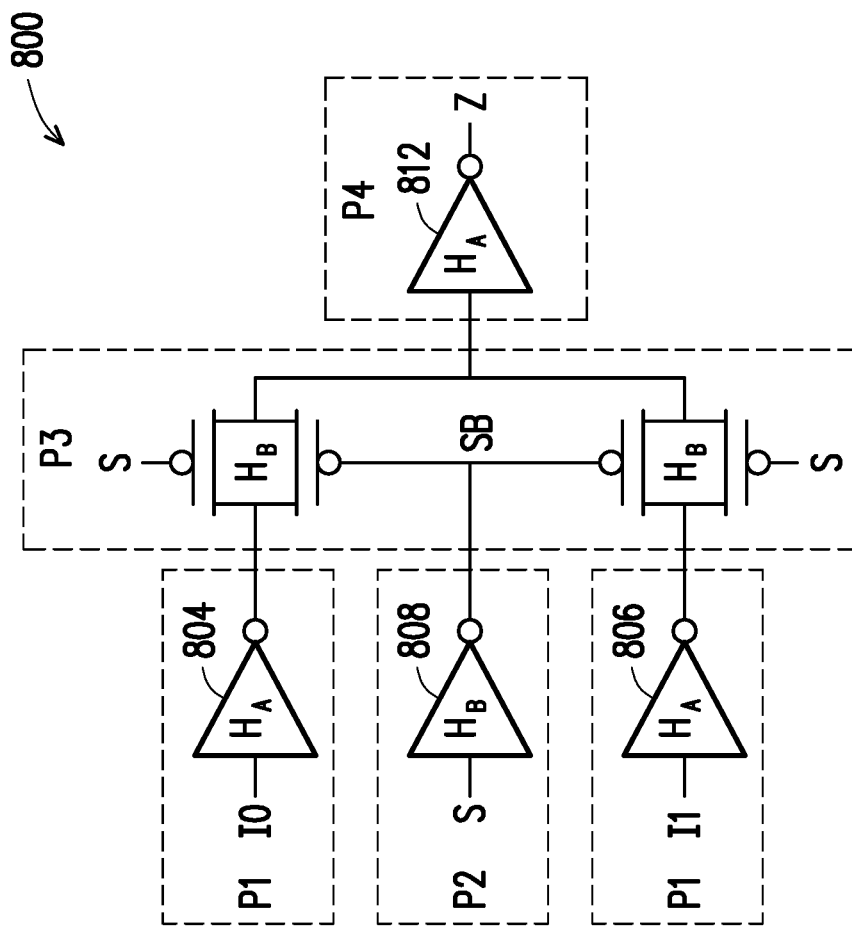
FIGS. 8A and 8B depict an example hybrid finFET cell for a multiplexer in accordance with some embodiments.
Figure 8B:
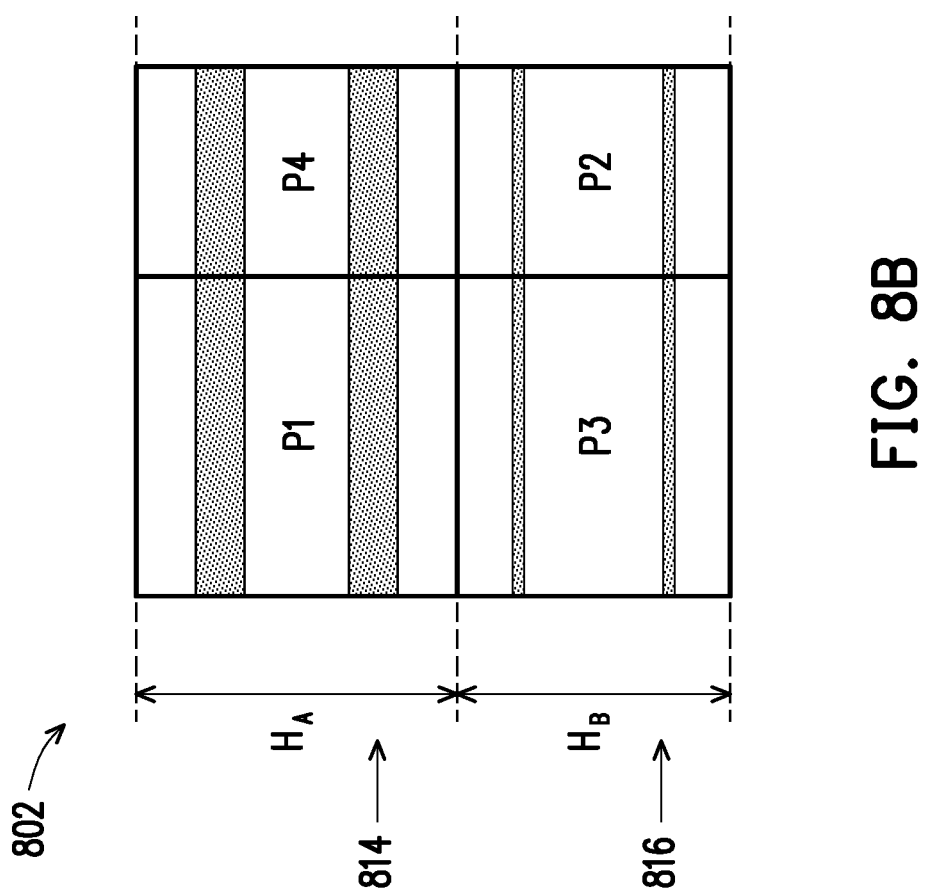

FIGS. 8A and 8B depict an example hybrid finFET cell for a multiplexer. The circuit diagram 800 of the example multiplexer circuit is shown in FIG. 8A, and the cell layout 802 for the multiplexer is shown at FIG. 8B. With reference first to FIG. 8A, the multiplexer circuit 800 includes two input inverter stages 804, 806 that are respectively coupled to signal input terminals I0 and I1, a selection inverter stage 808 that is coupled to a select terminal S, a switching stage 810, and an output inverter stage 812. In operation, the switching stage 810 of the multiplexer 800 is controlled by the output (SB) of the selection inverter stage 808 to select one of the two input signals (I0 or I1) to pass through to the multiplexer output (Z).

Cross referencing FIGS. 8A and 8B, portions of the multiplexer circuit 800 are included in a high fin row 814 of the hybrid cell layout 802, and other portions of the multiplexer circuit 800 are included in a less fin row 816 of the hybrid cell layout 802. Specifically, the two input inverter stages 804, 806 and the output inverter stage 812 are each included in the high fin row 814, and the selection inverter stage 808 and switching stage 810 are each included in the less fin row 816. Implementing the multiplexer circuit 800 in a double height ($H_A+H_B$) cell 802, as shown, may improve circuit performance (speed) and/or power consumption over that of the same circuit 800 implemented in other layout configurations. The improved performance results, at least in part, from the resultant driving ratio achieved by placing the input inverter stages 804, 806 in a high fin row 814 and the switching stage 810 in a less fin row 816. For example, the inventors found an approximate 18% improvement in speed over a previous design that was not optimized in this way.

Figure 9:
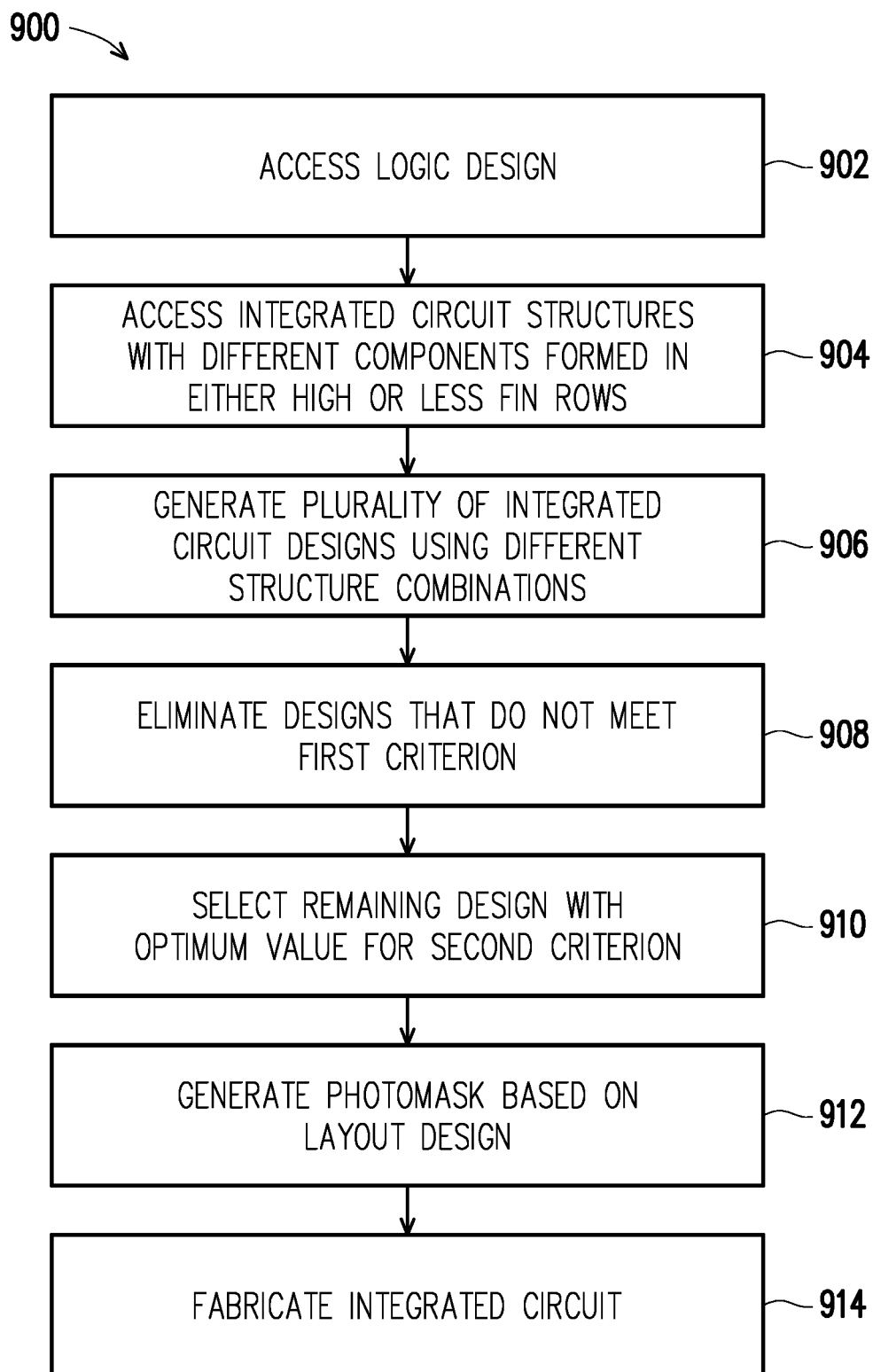
FIG. 9 is a flow diagram of an example method for fabricating a hybrid integrated circuit, in accordance with some embodiments.

FIG. 9 is a flow diagram for an example method 900 of fabricating an integrated circuit cell to perform a function. While the method 900 of FIG. 9 is applicable to many structures, reference to structures of FIGS. 1A-8B are included here for each in understanding. At 902, a logic design (e.g., 300, 400, 500, 600 or 700), including a plurality of logic components, is accessed for implementing the function of the integrated circuit cell. At 904, a plurality of integrated circuit structures are accessed for implementing one or more of the logic components. The plurality of integrated circuit structures may include a first integrated circuit structure that includes a first circuit component (e.g., 306, 406, 506) having finFETs formed in a high fin portion of the integrated circuit cell, and a second integrated circuit structure that includes a second circuit component (e.g., 304, 404, 504) having finFETs formed in a less fin portion of the integrated circuit cell.

At 906, a plurality of integrated circuit designs (e.g., 600, 700) are generated that use different combinations of the plurality of integrated circuit structures that implement the function. The generated integrated circuit designs (e.g., 600, 700) are filtered at 908 to eliminate designs that do not meet a first integrated circuit criterion (e.g., a speed or power consumption threshold). A remaining integrated circuit design that has an optimum value for a second integrated circuit criterion (e.g., speed or power consumption) is then selected at 910. At 912, the completed integrated circuit design layout may be used to generate a photomask. The photomask may then be used, at 914, to fabricate an integrated circuit.

Figure 10:
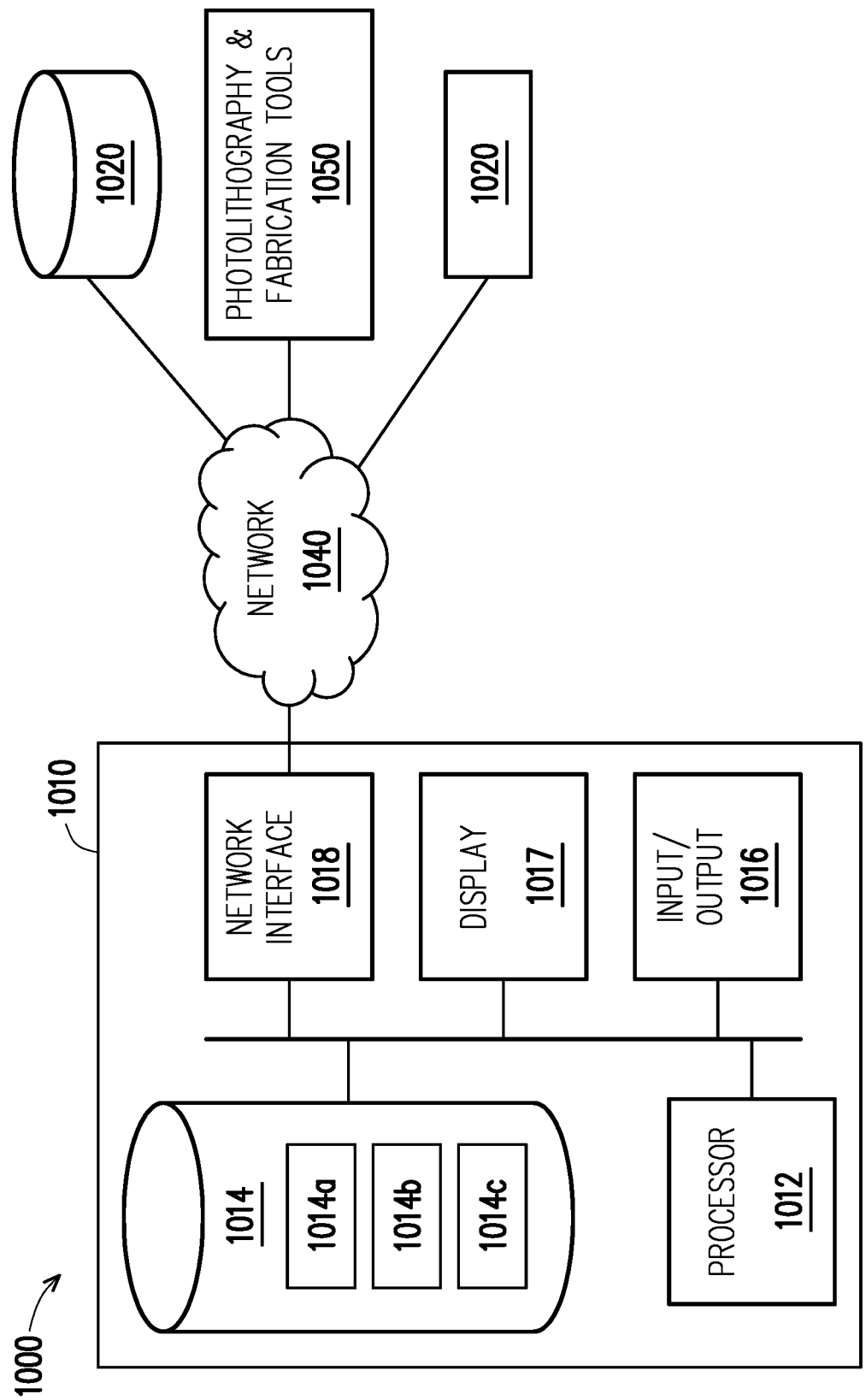
FIG. 10 is a functional block diagram of an example system for forming and fabricating a layout design in accordance with some embodiments.

FIG. 10 is a functional block diagram of an example system 1000 for forming and fabricating a layout design in accordance with some embodiments. System 1000 is usable for implementing one or more operations of the method 900 disclosed in FIG. 9, and further explained in conjunction with FIGS. 1-8.

System 1000 includes a first computer system 1010, a second computer system 1020, a networked storage device 1030, photolithography and fabrication tools 1050, and a network 1040 connecting the first computer system 1010, the second computer system 1020, the networked storage device 1030, and the photolithography and fabrication tools 1050.

The first computer system 1010 includes a hardware processor 1012 communicatively coupled with a non-transitory computer readable storage medium 1014 encoded with, i.e., storing, a set of instructions 1014a, a layout design 1014b, and any intermediate data 1014c for executing the set of instructions 1014a. The processor 1012 is electrically and communicatively coupled with the computer readable storage medium 1014. The processor 1012 is configured to execute the set of instructions 1014a encoded in the computer readable storage medium 1014 in order to cause the computer 1010 to be usable as a layout designing tool for performing a method 900 as described in conjunction with FIG. 9.

In some embodiments, the set of instructions 1014a, the layout design 1014b, and/or the intermediate data 1014c are stored in a non-transitory storage medium other than storage medium 1014. In some embodiments, some or all of the set of instructions 1014a, the layout design 1014b, or the intermediate data 1014c are stored in a non-transitory storage medium in networked storage device 1030 or second computer system 1020. In such case, some or all of the set of instructions 1014a, the layout design 1014b, or the intermediate data 1014c stored outside computer 1010 is accessible by the processor 1012 through the network 1040.

In some embodiments, the processor 1012 is a central processing unit (CPU), a multi-processor, a distributed processing system, an application specific integrated circuit (ASIC), and/or a suitable processing unit.

In some embodiments, the computer readable storage medium 1014 is an electronic, magnetic, optical, electromagnetic, infrared, and/or a semiconductor system (or apparatus or device). For example, the computer readable storage medium 1014 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1014 includes a compact disk-read only memory (CD-ROM), a compact disk-read/write (CD-R/W), and/or a digital video disc (DVD).

The computer system 1010 includes, in at least some embodiments, an input/output interface 1016 and a display unit 1017. The input/output interface 1016 is coupled to the processor 1012 and allows the circuit designer to manipulate the first computer system 1010. In at least some embodiments, the display unit 1017 displays the status of executing the set of instructions 1014a and, in at least some embodiments, pro-vides a Graphical User Interface (GUI). In at least some embodiments, the display unit 1017 displays the status of at least some embodiments, the input/output interface 1016 and the display 1017 allow an operator to operate the computer system 1010 in an interactive manner.

In at least some embodiments, the computer system 1000 also includes a network interface 1018 coupled to the processor 1012. The network interface 1018 allows the computer system 1010 to communicate with the network 1040, to which one or more other computer systems are connected. The network interface includes wireless network interfaces such as BLUETOOTH, WIFI, WIMAX, GPRS, or WCDMA; or wired network interface such as ETHERNET, USB, or IEEE-1394.

In some embodiments, an integrated circuit design layout that is completed using the computing system 1000 in accordance with one or more of the processes described above with reference to FIGS. 1-9 may be transferred to one or more photolithography and fabrication tools 1050 to generate a photomask and fabricate an integrated circuit.

In one embodiment, an integrated circuit cell includes a first circuit component and a second circuit component. The first circuit component includes fin field-effect transistors (finFETs) formed in a high fin portion of the integrated circuit cell, the high fin portion of the integrated circuit including a plurality of fin structures arranged in rows. The second circuit component that includes finFETs formed in a less fin portion of the integrated circuit cell, the less fin portion of the integrated circuit including a lesser number of fin structures than the high fin portion of the integrated circuit cell.

In one embodiment, an integrated circuit cell for a flip-flop includes a first stage and a second stage. The first stage is configured to receive a flip-flop input and pass the flip-flop input through to a first stage output in response to a clock signal. The first stage includes field-effect transistors (finFETs) formed in one of a high fin portion of the integrated circuit cell or a less fin portion of the integrated circuit cell based on a performance optimization criterion, wherein the high fin portion of the integrated circuit cell includes a plurality of fin structures arranged in rows, and the less fin portion of the integrated circuit cell includes a lesser number of fin structures than the high fin portion of the integrated circuit cell. The second stage is configured to receive the first stage output and generate a first latched output in response to the clock signal, the second stage including finFETs in a forward path that are formed in the high fin portion of the integrated circuit and finFETs in a feedback path that are formed in the less fin portion of the integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit cell, comprising:
   a first stage including a first logic gate that includes fin field-effect transistors (finFETs) formed in a first fin portion of the circuit cell, the first fin portion of the circuit cell including a plurality of first fin structures arranged in a plurality of first rows;
   a second stage including a second logic gate that has an output connected to an input of the first logic gate and that includes finFETs formed in the first fin portion or a second fin portion of the circuit cell, the second fin portion of the circuit cell including a plurality of second fin structures arranged in a plurality of second rows, wherein each of the second rows, in the second fin portion, contain a lesser number of fin structures than each of the first rows, in the first fin portion of the circuit cell, and the first fin portion and the second fin portion are separated by an isolation structure; and
   a third stage configured to provide a stage output and including finFETs formed in the first row, the second row, or the first and second rows.

2. The circuit cell of claim 1, wherein the circuit cell is optimized for speed based on inclusion of the first logic gate in the first fin portion.

3. The circuit cell of claim 1, wherein the circuit cell is optimized for power consumption based on inclusion of the second logic gate in the second fin portion.

4. The circuit cell of claim 1, wherein the circuit cell is arranged in a double height cell layout with the first fin portion and the second fin portion being arranged in adjacent rows.

5. The circuit cell of claim 1, further comprising a third logic gate formed in the first fin portion, the second fin portion, or the first and second fin portions.

6. The circuit cell of claim 1, wherein the second logic gate further includes finFETs formed in the first fin portion.

7. The circuit cell of claim 1, wherein the first logic gate is an inverter.

8. The circuit cell of claim 1, wherein the second logic gate is an inverter.

9. The circuit cell of claim 1, wherein the first logic gate further includes finFETs formed in the second fin portion of the circuit cell.

10. A circuit cell for a flip-flop, comprising:
    a first stage configured to receive a flip-flop input and pass the flip-flop input through to a first stage output in response to a signal, the first stage including field-effect transistors (finFETs) formed in one of a first fin portion of the circuit cell or a second fin portion of the circuit cell based on a performance optimization criterion, wherein the first fin portion of the circuit cell includes a first plurality of fin structures arranged in a plurality of first rows, and the second fin portion of the circuit cell includes a second plurality of fin structures arranged in a plurality of second rows, wherein each of the second rows, in the second fin portion, contain a lesser number of fin structures than each of the first rows, in the first fin portion of the circuit cell;
    a second stage connected to the first stage and configured to receive the first stage output and generate a first latched output in response to the signal, the second stage including finFETs in a forward path that are formed in the first fin portion of the circuit cell and finFETs in a feedback path that are formed in the second fin portion of the circuit cell; and
    a third stage configured to generate a second stage output and including finFETs formed in the first fin portion, the second fin portion, or the first and second fin portions.

11. The circuit cell of claim 10, wherein the performance optimization criterion is one of speed or power consumption.

12. The circuit cell of claim 10, wherein the third stage is configured to receive the first latched output and pass the first latched output through to the second stage output in response to the signal and the finFETs of the third stage are formed in the first fin portion of the circuit cell.

13. The circuit cell of claim 10, wherein the third stage is configured to receive a third stage output and generate a second latched output that serves as the second stage output in response to the signal, the finFETs of the third stage including finFETs in a forward path formed in the first fin portion of the circuit cell, and finFETs in a feedback path formed in one of the first fin portion or the second fin portion of the circuit cell based on the performance optimization criterion.

14. The circuit cell of claim 10, wherein the third stage is configured to invert a third stage output to generate a flip-flop output that serves as the second stage output and the finFETs of the third stage are formed in the first fin portion of the circuit cell.

15. The circuit cell of claim 10, wherein the circuit cell is arranged in a double height cell layout with the first fin portion and the second fin portion being arranged in adjacent rows.

16. A circuit cell for a multiplexer, comprising:
   a first stage configured to receive a first input signal and including a plurality of fin field-effect transistors (finFETs) formed in a first row;
   a second stage configured to receive a select signal and including a plurality of finFETs formed in a second row, wherein the first row has a greater number of fin structures than the second row; and
   a third stage configured to provide a stage output and including finFETs formed in the first row, the second row, or the first and second rows.

17. The circuit cell of claim 16, wherein the third stage is configured to provide an output of the multiplexer that serves as the stage output and the finFETs of the third stage are formed in the first row.

18. The circuit cell of claim 16, wherein the third stage is connected to the first stage and the finFETs of the third stage are formed in the second row.

19. The circuit cell of claim 16, wherein the third stage is configured to receive a second input signal and the finFETs of the third stage are formed in the first row.

20. The circuit cell of claim 16, wherein the third stage is connected to the second stage and the finFETs of the third stage are formed in the second row.

* * * * *